United States Patent [19]
Galicki et al.

[11] Patent Number: 5,198,090
[45] Date of Patent: Mar. 30, 1993

[54] SPUTTERING APPARATUS FOR PRODUCING THIN FILMS OF MATERIAL

[75] Inventors: Arkadi Galicki, Cupertino; Cheng T. Horng; Robert O. Schwenker, both of San Jose, all of Calif.

[73] Assignee: International Business Machines Corporation, Armonk, N.Y.

[21] Appl. No.: 807,766

[22] Filed: Dec. 6, 1991

Related U.S. Application Data

[63] Continuation of Ser. No. 576,254, Aug. 31, 1990, abandoned.

[51] Int. Cl.⁵ .................................................. C23C 14/34
[52] U.S. Cl. ........................... 204/298.11; 204/192.2; 204/298.23; 204/298.28
[58] Field of Search ........... 204/192.15, 192.2, 298.11, 204/298.23, 298.28

[56] References Cited

U.S. PATENT DOCUMENTS

| | | | |
|---|---|---|---|
| 3,904,503 | 9/1975 | Hanfmann | 204/192 |
| 4,315,960 | 2/1982 | Ohji et al. | 427/248.1 |
| 4,426,265 | 1/1984 | Brunsch et al. | 204/192.2 |
| 4,548,698 | 10/1985 | Sellschopp | 204/298.11 |
| 4,576,699 | 3/1986 | Sato et al. | 204/192.2 X |
| 4,808,489 | 2/1989 | Abe et al. | 204/192.2 X |
| 4,816,127 | 3/1989 | Eltoukhy | 204/192.2 X |

FOREIGN PATENT DOCUMENTS 60-197869 10/1985 Japan .

*Primary Examiner*—Nam X. Nguyen
*Attorney, Agent, or Firm*—Otto Schmid, Jr.

[57] ABSTRACT

A sputtering apparatus for coating a substrate comprising a first electrode for supporting a target material and a second electrode for supporting a substrate, upon which the coating is deposited. A source of RF power is connected to impose an RF voltage across the electrodes to produce a glow discharge in the space between the electrodes, and shutter means is provided in the space between the electrodes. The shutter means has means for blocking a substantial part of the sputtered atoms from the target electrode glow discharge traveling at or near normal incidence and at least one opening shaped to permit a substantial part of the sputtered atoms from the target electrode traveling at an oblique angle to impinge upon the substrate to produce a thin film coating of the target material.

13 Claims, 3 Drawing Sheets

SPUTTERING APPARATUS FOR PRODUCING THIN FILMS OF MATERIAL

This application is a continuation of application Ser. No. 07/576,254 filed Aug. 8, 1990, which has been abandoned.

FIELD OF THE INVENTION

The invention relates to sputtering apparatus and, more particularly, to sputtering apparatus for producing thin films of material.

DESCRIPTION OF THE PRIOR ART

Sputtering apparatus has been extensively used in the production of thin films of material. In depositing these films, a variety of properties are of concern, and many factors, which may involve the particular apparatus being used, determine these properties of interest. In addition, in order to increase the processing rate in manufacturing, the substrates upon which the thin films of material are deposited, are moved in a continuous fashion during the deposition process. This is an added variable which affects the film properties, and may cause the uniformity of the film properties to be poor and/or difficult to control.

Among the thin film properties considered to be important are the thickness of the thin film of material and the thickness uniformity of the thin film of material over the area of the substrate. U.S. Pat. No. 3,904,503 describes a sputtering apparatus in which a solid shield member is inserted between the target and substrate during some part of the sputtering time and then withdrawn. When the shield member is in place, a portion of the substrate is shaded to prevent excess deposition of material, thereby producing improved uniformity of thickness of the material.

U.S. Pat. No. 4,315,960 shows a sputtering apparatus in which two solid mask plates are located between the target and the substrate. The mask plates are reciprocated relative to each other and to the substrate during deposition of material so that the thin films are produced with uniform thickness.

Japanese published unexamined patent application 60-197869 shows a sputtering apparatus in which a mask plate is positioned between the target and the substrate. The mask plate has an opening through which the sputtered material passes, and the opening is widest at the ends of the opening and narrowest at the middle of the opening so that the thickness of the thin films deposited on the substrates is almost uniform.

The prior art does not show sputtering apparatus which produces thin films of material with uniform thickness across a substrate and from substrate to substrate by blocking a substantial part of the sputtered atoms from the target electrode traveling at or near normal incidence to the substrate.

SUMMARY OF THE INVENTION

It is therefore the principal object of this invention to provide sputtering apparatus in which thin films of material can be deposited with uniform thickness.

In accordance with the invention, the sputtering apparatus comprises a first electrode and means for supporting a target member of a suitable material on the first electrode, and a second electrode and means for supporting a substrate on the second electrode adjacent to and in alignment with the first electrode, and means to produce relative motion between the first and second electrodes. A source of RF power is coupled to impose an RF voltage across the first and second electrodes to produce a glow discharge in the space between the first and second electrodes. Shutter means is positioned between the first and second electrodes, and the shutter means has means for blocking a substantial part of the sputtered atoms emanating from the target surface traveling at or near normal incidents to the substrate and at least one opening shaped to permit a substantial part of the sputtered atoms traveling at an oblique angle to impinge upon the substrate and produce a coating of the material having a uniform thickness.

This sputtering apparatus is particularly useful for depositing an oriented magnetic film without the use of an external applied magnetic field to align the magnetic material. By depositing at an oblique angle of incidence, magnetic films with anisotropic properties can be produced in a chosen direction.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
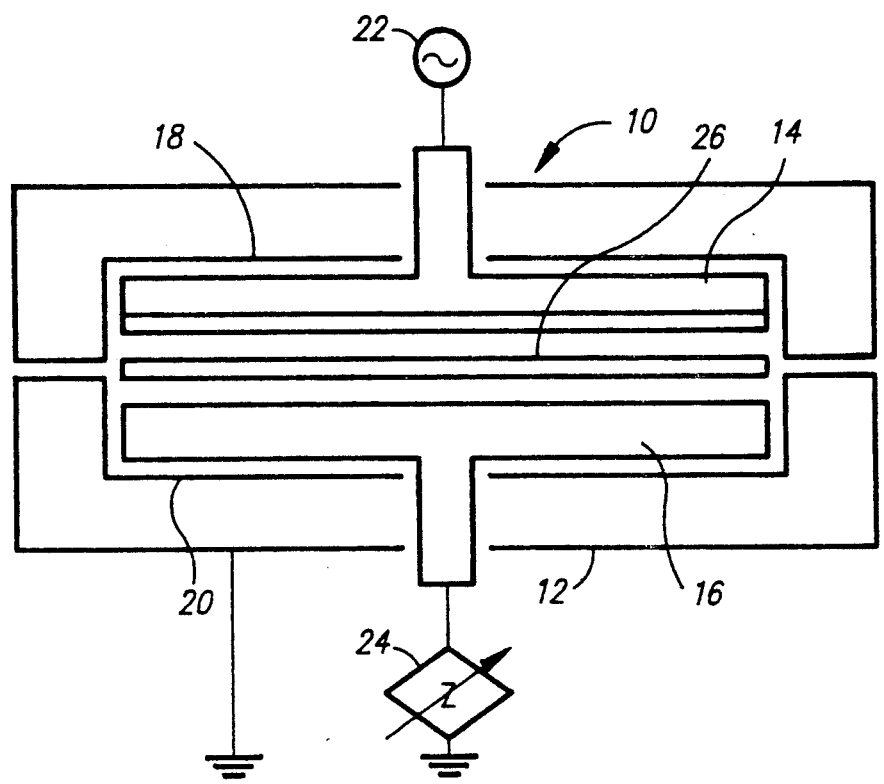
FIG. 1 is a schematic view showing the general arrangement of the elements and power supply of the sputtering apparatus of the present invention.

Referring to FIG. 1, the general structure of the electrode assemblies and the power supply is shown for the sputtering apparatus according to the present invention. The sputtering apparatus 10 of the invention comprises a vacuum enclosure 12 and vacuum pumps (not shown) to evacuate the sputtering enclosure to a desired background pressure level. A suitable sputtering gas such as argon, for example, is then fed into the enclosure to provide the necessary background environment for sputter deposition.

A target electrode assembly 14 to which a circular disk-shaped target body is mounted is positioned within the enclosure 12, and a substrate electrode assembly 16 is positioned adjacent to and facing the target electrode assembly 14. The electrode assemblies 14 and 16 may be water cooled to maintain a desired temperature during operation. To eliminate spurious sputtering that may occur at the back of the electrode assemblies 14 and 16, each electrode assembly 14 and 16 has a ground shield 18 and 20, respectively, surrounding the peripheral and back portions of the electrode assembly, thereby leaving the face of the electrode assemblies exposed for supporting target bodies and substrates to be coated.

The power supply 22 is connected to supply an RF voltage potential across target electrode assembly 14, substrate electrode assembly 16, and variable impedance 24 to produce a glow discharge in the space between the target electrode assembly 14 and the substrate electrode assembly 16.

The capacitive and inductive components of variable impedance 24 can be varied to control the voltage to substrate electrode assembly 16 to provide control over the properties of the films deposited by the sputtering apparatus. Alternatively, sputtering of the target material can be done by using the DC sputtering mode.

According to the present invention, a shutter means having an opening, which will be described in detail below, is positioned between the target electrode assembly and the substrate electrode assembly. This structure enables the sputtering apparatus to produce thin films of material with uniform thickness across a substrate and from substrate to substrate by blocking a substantial part of the sputtered atoms from the target(s) traveling at or near normal incidence to the substrates and permitting a substantial part of the sputtered atoms traveling at an oblique angle to impinge upon the substrate to produce the thin film of material.

Figure 4:
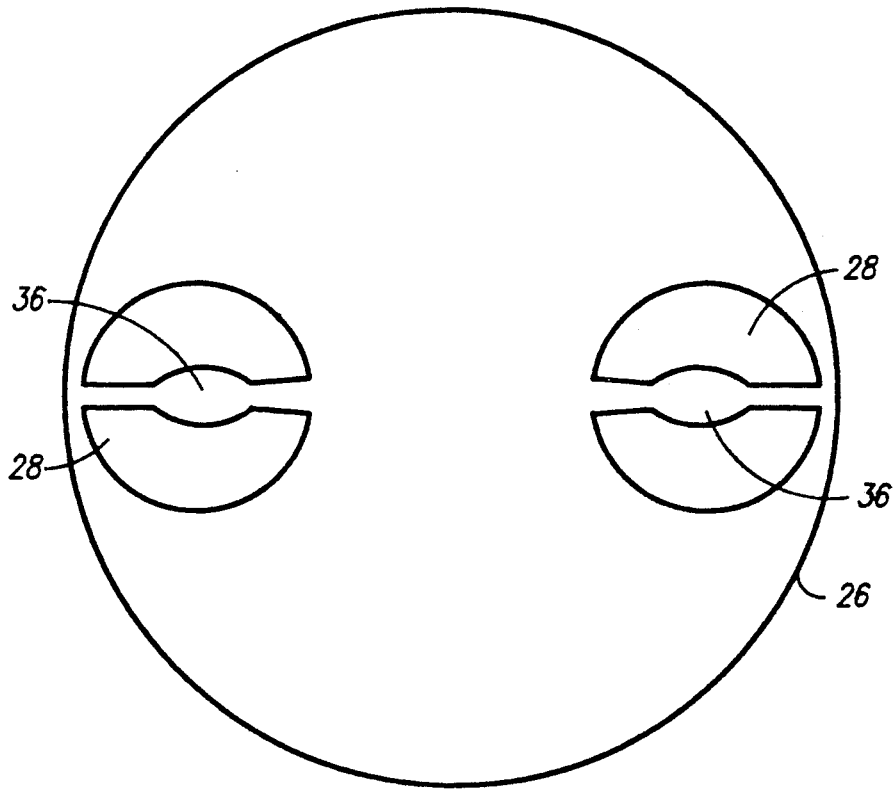
FIG. 4 is a plan view of a specific embodiment of the shutter means.

As shown in FIG. 1, a shutter means 26 is fixed in position in the space between target electrode assembly 14 and substrate electrode assembly 16. Shutter means 26, as shown in FIG. 4, has at least one opening 28 through which sputtered atoms from the target member 30, mounted on target electrode assembly 14, can impinge on a substrate 32 which is mounted on substrate electrode assembly 16.

In the embodiment shown in the drawings (FIG. 3), target electrode assembly 14 comprises two target members 30 mounted along opposite ends of a radial line. Target members 30 comprise a suitable material chosen for the thin films which are to be deposited on the substrates. The material may comprise metals and/or alloys and may comprise ferromagnetic metals and/or alloys. In the embodiment of the substrate electrode assembly 16 shown in the drawings (FIG. 2) a plurality of substrates 32 are mounted around a central opening. Relative motion is provided between target electrode assembly 14 and substrate electrode assembly 16 in the direction of the arrow 34.

Figure 5:
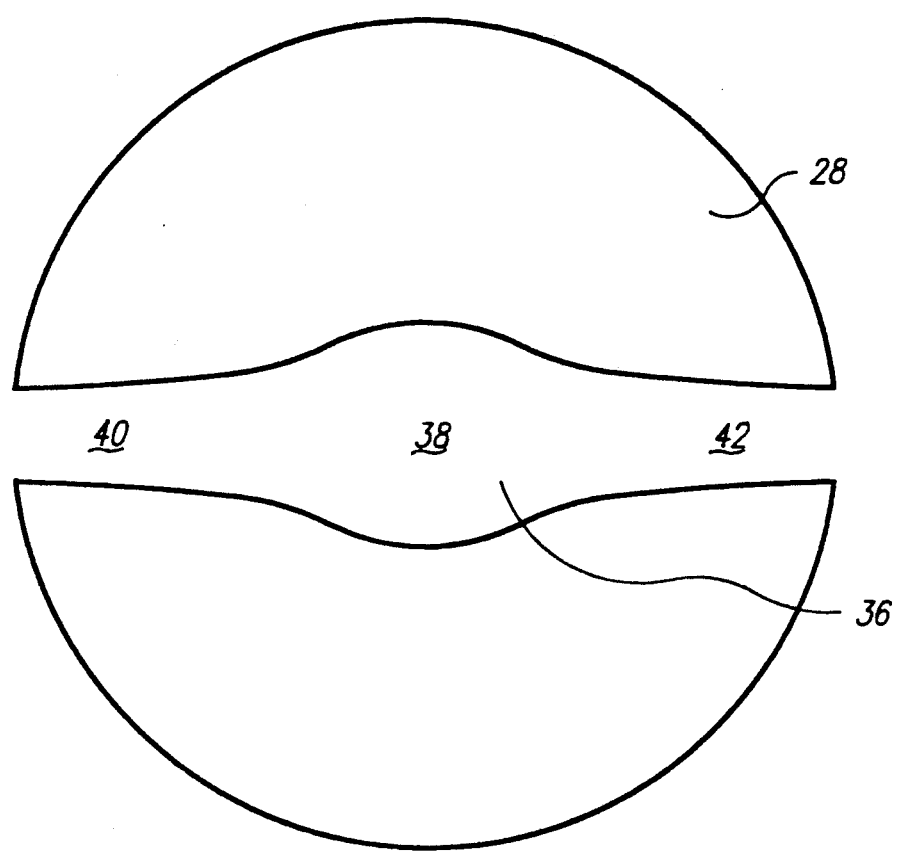
FIG. 5 is an enlarged view showing the detailed shape of the openings in the shutter means of FIG. 4.

In the embodiment of the shutter means 26 shown in the drawing (FIG. 4), two openings 28 are provided with an opening 28 in alignment with each of the target members 30. Opening 28 comprise an opening of substantially the same shape as the target member 30 with the exception of a masking member 36 which extends radially across the center of opening 28. Masking member 36 (FIG. 5) comprises a wider central area 38 supported by narrower spoke portions in which the central spoke portion 40 (i.e. the portion nearest the center of shutter means 26) is wider than the outside spoke portion 42.

During the glow discharge sputtering, the target atoms are ejected from the target surface at various angles, so a distribution of sputtered atoms is produced with the peak distribution in a direction normal to the target member 30. Since opening 28 is aligned with target member 30, the central area 38 of masking member 36 is in a position to block a substantial part of the sputtered atoms traveling at or near normal incidence to the substrate 32. However, a substantial part of the sputtered atoms traveling at an oblique angle goes through the opening 28 on either side of masking member 36 and impinges on a substrate 32 to produce a thin film of the target member 30 material on the substrate 32.

The sputtering apparatus according to the present invention functions to provide a thin film of a variety of materials having a uniform thickness both on a substrate as well as from substrate to substrate.

When depositing ferromagnetic metals and/or alloys in the prior art, it is generally required that the thin film of ferromagnetic material be deposited in the presence of an external applied magnetic field should it be desired to have a thin film of magnetic material with magnetization oriented in a chosen direction.

Figure 2:
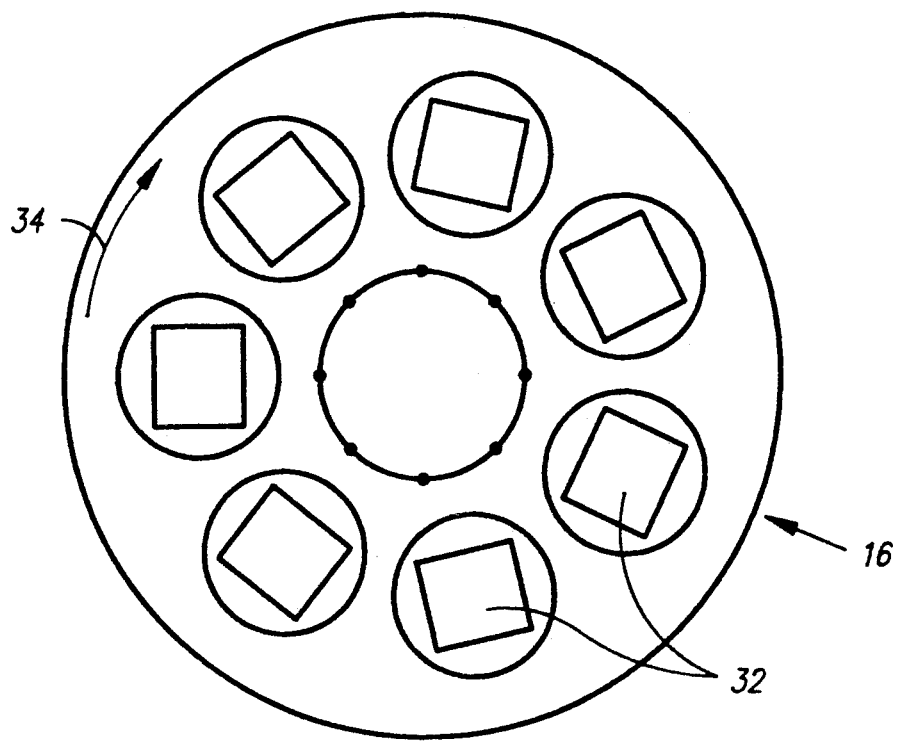
FIG. 2. is a schematic plan view of a specific embodiment of the substrate electrode assembly with substrate loaded.
Figure 3:
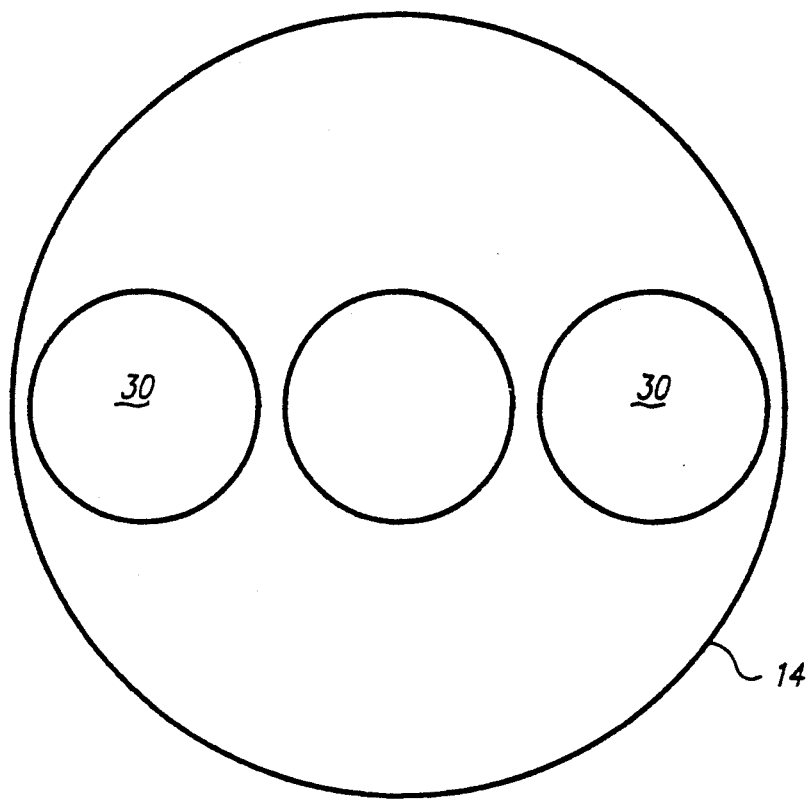
FIG. 3 is a schematic plan view of a specific embodiment of the target electrode assembly.

It has been discovered that thin films of magnetic materials, such as NiFe and Sendust, for example, can be deposited by the sputtering apparatus according to the present invention and achieve a thin film of magnetic material oriented in a particular direction without the use of an external applied magnetic field to orient the magnetic material. In this case the easy axis of the thin film of magnetic material is in the radial direction as the substrates 32 are shown in FIG. 2.

While the invention has been particularly shown and described with reference to a preferred embodiment thereof, it will be understood by those skilled in the art that various other changes in the form and details may be made therein without departing from the spirit and scope of the invention.

We claim:

1. Sputtering apparatus for coating a substrate with a chosen material comprising:
    a first electrode and means for supporting a target member of said chosen material on said first electrode, said target member having a substantially planar surface;
    a second electrode and means for supporting a plurality of substrates on said second electrode adjacent to and in alignment with said first electrode, said substrates being located substantially equidistant from the center of the substrate supporting means;
    means for producing relative rotational motion between said first and second electrodes about an axis through the center of the substrate supporting means;
    a source of power arranged to impose a voltage across said first and second electrodes to produce a glow discharge in the space between substantially the entire surface of said planar target member and said second electrode, said glow discharge having a peak distribution of sputtered atoms in a direction normal to said first electrode; and
    shutter means positioned between substantially the entire surface of said planar target member and said second electrode, said shutter means having means for blocking a substantial part of the sputtered atoms from said target member traveling at or near normal incidence to said substrates and at least one opening shaped to permit a substantial part of the sputtered atoms from said target member traveling at an oblique angle to impinge upon said substrates to produce a substantially uniformly thick coating of said chosen material upon substantially the entire surface of said substrates.

2. The sputtering apparatus according to claim 1 wherein said chosen material comprises a metal or an alloy.

3. The sputtering apparatus of claim 1 wherein said first electrode supports a plurality of target members and said shutter means has a plurality of openings with an opening in alignment with each of said target members.

4. The sputtering apparatus of claim 1 wherein said means for blocking a substantial part of said sputtered atoms traveling at or near normal incidence comprises an elongated masking member extending radially across said opening, said elongated masking member having a central region which separates two end regions, said central region being wider than said end regions.

5. The sputtering apparatus according to claim 1 wherein said target member comprises a substantially flat disk-shaped target body.

6. Sputtering apparatus for coating a substrate with a ferromagnetic material comprising:
   a first electrode and means for supporting a target member of a ferromagnetic material on said first electrode, said target member having a substantially planar surface;
   a second electrode and means for supporting a plurality of substrates on said second electrode adjacent shutter means positioned to and in alignment with said first electrode, said substrates being located substantially equidistant from the center of the substrate supporting means;
   means for producing relative rotational motion between said first and second electrodes about an axis through the center of the substrate supporting means;
   a source of power arranged to impose a voltage across said first and second electrodes to produce a glow discharge in the space between substantially the entire surface of said planar target member and said second electrode, said glow discharge having a peak distribution of sputtered atoms in a direction normal to said first electrode; and shutter means positioned between substantially the entire surface of said planar target member and said second electrode, said shutter means having means for blocking a substantial part of the sputtered atoms from said target member traveling at or near normal incidence to said substrates and at least one opening shaped to permit a substantial part of the sputtered atoms from said target member traveling at an oblique angle to impinge upon said substrates to produce a substantially uniformly thick coating of said chosen material upon substantially the entire surface of said substrates.

7. The sputtering apparatus according to claim 6 wherein said ferromagnetic material comprises a metal or an alloy.

8. The sputtering apparatus according to claim 7 wherein said ferromagnetic material is selected from the group consisting of NiFe and Sendust.

9. The sputtering apparatus according to claim 7 wherein said ferromagnetic material is oriented with an easy axis in a direction normal to the direction of relative motion.

10. The sputtering apparatus of claim 6 wherein said first electrode supports a plurality of target members and said shutter means has a plurality of openings with an opening in alignment with each of said target members.

11. The sputtering apparatus of claim 6 wherein said means for blocking a substantial part of said sputtered atoms traveling at or near normal incidence comprises an elongated masking member extending radially across said opening, said elongated masking member having a central region which separates two end regions, said central region being wider than said end regions.

12. The sputtering apparatus of claim 11 wherein said shutter means comprises an opening on each side of said elongate masking member.

13. The sputtering apparatus according to claim 6 wherein said target member comprises a substantially flat disk-shaped target body.

* * * * *

UNITED STATES PATENT AND TRADEMARK OFFICE
CERTIFICATE OF CORRECTION

PATENT NO. : 5,198,090

DATED : March 30, 1993

INVENTOR(S) : Arkadi Galicki, Cheng Horng, Robert Schwenker

It is certified that error appears in the above-identified patent and that said Letters Patent is hereby corrected as shown below:

Column 1, line 6, "Aug. 8" should read --Aug. 31--.

Signed and Sealed this

Fourth Day of January, 1994

Attest:

BRUCE LEHMAN

*Attesting Officer*     *Commissioner of Patents and Trademarks*